(12) United States Patent
Yanagida et al.

(10) Patent No.: US 11,908,534 B2
(45) Date of Patent: Feb. 20, 2024

(54) SEMICONDUCTOR DEVICE INCLUDING ABNORMALITY DETECTION CIRCUIT AND SEMICONDUCTOR DEVICE CONTROL METHOD FOR DETECTING ABNORMALITY

(71) Applicant: FUJITSU LIMITED, Kawasaki (JP)

(72) Inventors: Masahiro Yanagida, Yokohama (JP); Hiroyuki Fujimoto, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 150 days.

(21) Appl. No.: 17/573,310

(22) Filed: Jan. 11, 2022

(65) Prior Publication Data
US 2022/0336034 A1 Oct. 20, 2022

(30) Foreign Application Priority Data
Apr. 16, 2021 (JP) .................................. 2021-069606

(51) Int. Cl.
*G11C 29/00* (2006.01)
*G11C 29/38* (2006.01)

(52) U.S. Cl.
CPC .................................. *G11C 29/38* (2013.01)

(58) Field of Classification Search
CPC .................................................... G11C 29/38
See application file for complete search history.

(56) References Cited

U.S. PATENT DOCUMENTS

| 2002/0196683 | A1* | 12/2002 | Ohtani | G11C 29/72 |
| | | | | 365/200 |
| 2003/0043648 | A1* | 3/2003 | Tsuji | G11C 29/848 |
| | | | | 365/200 |
| 2017/0269989 | A1* | 9/2017 | Kim | G11C 29/76 |

FOREIGN PATENT DOCUMENTS

JP 2003-068093 A 3/2003

* cited by examiner

*Primary Examiner* — Min Huang
(74) *Attorney, Agent, or Firm* — ArentFox Schiff LLP

(57) ABSTRACT

A semiconductor device includes a plurality of built-in memories, and each of the built-in memories includes a plurality of memory cells. Each built-in memory includes a selector circuit that connects a selected memory cell among the memory cells to an outside, a memory cell relief circuit that, when a fault has occurred in one of the memory cells, transmits, to the selector circuit, a relief signal configured to connect a normal memory cell to the outside without connecting the one of the memory cells in which the fault has occurred, to the outside, and switches selection in the selector circuit, and an abnormality detection circuit that performs abnormality detection for the memory cell relief circuit, based on a temporal change in the relief signal output from the memory cell relief circuit.

6 Claims, 15 Drawing Sheets

FIG. 6

| RESET (reset) | ENABLE (en) | DECODED RELIEF SIGNAL | CHANGE IN TIME DIRECTION | OR CIRCUIT OUTPUT | RS-FF |
|---|---|---|---|---|---|
| 1 | - | - | - | - | 0 |
| 0 | 0 | - | - | 0 | HOLD VALUE |
| 0 | 1 | CONSISTENT VALUE (NORMAL) | 1⇒1 or 0⇒0 | 0 | HOLD VALUE |
| 0 | 1 | VALUE CHANGES (ABNORMAL) | 1⇒0 or 0⇒1 | STAY AT 1 DURING DELAY TIME | 1 |

300

SEMICONDUCTOR DEVICE INCLUDING ABNORMALITY DETECTION CIRCUIT AND SEMICONDUCTOR DEVICE CONTROL METHOD FOR DETECTING ABNORMALITY

CROSS-REFERENCE TO RELATED APPLICATION

This application is based upon and claims the benefit of priority of the prior Japanese Patent Application No. 2021-69606, filed on Apr. 16, 2021, the entire contents of which are incorporated herein by reference.

FIELD

The embodiments discussed herein are related to a semiconductor device including an abnormality detection circuit and a semiconductor device control method for detecting an abnormality.

BACKGROUND

Large scale integration (LSI) typified by a processor includes an input/output (I/O) circuit for transmitting and receiving signals to and from the outside of the LSI, a core that performs control and calculation, a cache that holds data, and a common unit. Random access memories (RAMs) are built in the core and the cache. Hereinafter, the RAM built in the LSI is referred to as a built-in RAM. The common unit includes a built-in self-test (BIST) circuit that tests the built-in RAM, a test determination circuit that determines the test result, and a fuse that stores the address of a memory cell with a defect in the built-in RAM.

The built-in RAMs are divided into a memory cell array and peripheral circuits including a decoder circuit, a selector circuit, and a relief decoder circuit. Here, memory cells given the same binary digit (BIT) number are collectively referred to as a memory cell. The memory cell array contains a plurality of memory cells given different BIT numbers. This means that the set of the memory cells with all BIT numbers forms the memory cell array.

Since the memory cell array is finer and denser than the peripheral circuits, the malfunction rate tends to be relatively high. Thus, a memory cell relieving approach is widely known in which a replacement memory cell is provided in a memory cell array and a memory cell containing a defect is replaced with the replacement memory cell in units of memory cells to obtain a memory cell array that operates normally. Here, a memory cell in the memory cell array other than the replacement memory cell is called a usual memory cell. In the memory cell array, for example, 4-BIT usual memory cells can be assumed and the 1-BIT replacement memory cell can be assumed.

The selector circuit selects the usual memory cell and the replacement memory cell. The decoder circuit decodes the address. The relief decoder circuit and the fuse that stores a relief address are combined and called a memory cell relief circuit.

Memory cell relief is performed by replacing a defective memory cell, which is a usual memory cell containing a defect, with the replacement memory cell. The selector circuits that select each usual memory cell are arranged in a one-to-one association with the usual memory cells with each BIT number. Each selector circuit can be switched so as to select either the associated usual memory cell, or a usual memory cell or a replacement memory cell arranged adjacent.

The selector circuit is controlled by a decoded relief signal output from the relief decoder circuit. When there is no defective memory cell, the replacement memory cell is not used, and the usual memory cell is connected to the outside of the built-in RAM via the selector circuit. The replacement operation of replacing the defective memory cell with the replacement memory cell is implemented by controlling each selector circuit such that the defective memory cell is not selected but the adjacent usual memory cell is selected, and controlling such that the replacement memory cell is finally selected.

When the memory cell relief is prepared, the built-in RAM performs the following operations during service. Here, description will be given using a case where there are usual memory cells with BIT numbers of 0 to 3 and a replacement memory cell with a BIT number of 4, and selector circuits numbered SEL 0 to 3 are arranged for each usual memory cell. The relief decoder circuit decodes the relief address acquired from the fuse and generates the decoded relief signal. For example, when the usual memory cell with a BIT number of 1 is a defective memory cell, the relief decoder circuit generates a decoded relief signal that causes the selector circuit with SEL 0 to select the usual memory cell with a BIT number of 0 and causes the selector circuits with SEL 1 to 3 to select the usual memory cells and the replacement memory cell with BIT numbers of 2 to 4. The selector circuits with SEL 0 to 3 connect the usual memory cells and the replacement memory cell whose BIT numbers are other than 1 to the outside of the built-in RAM in accordance with the input decoded relief signal. This causes the memory cell relief to function and suppresses the use of the usual memory cell with a BIT number of 1, which is a defective memory cell. Note that, since the value of the decoded relief signal is designated by the relief address stored in the fuse, the value does not change during the operation of the built-in RAM.

The defective memory cell is located in a pre-shipment test, and the relief address indicating the position of the defective memory cell obtained in the test is saved in a nonvolatile storage element such as a fuse. The nonvolatile storage element may be placed outside or inside the built-in RAM. The nonvolatile storage element and the relief decoder are connected by a parallel connection for direct connection or a serial connection using a scan chain or the like. Note that whether or not the memory cell relief is to be carried out and the relief address and the like when the memory cell relief is carried out are also saved as a part of manufacturing data as memory cell relief information.

Incidentally, in the LSI, a failure sometimes occurs at the time of development and in the market after shipment from the factory. When a failure has occurred, failure analysis is performed to investigate the cause and formulate countermeasures for the purpose of deterring the recurrence. The RAM failure analysis for the LSI is performed as follows. First, failure information is collected and confirmed. For example, information such as the working voltage, operating speed, environmental temperature, what kind of circuit operation was performed at the time of the occurrence of failure, and the manufacturing number and pre-shipment test result for the LSI are confirmed in as much detail as possible. Next, it is estimated which portion of the built-in RAM has failed, on the basis of the information obtained from the confirmation of failure occurrence situation. Here, the failure is classified into three types: an address abnormality, a data abnormality, and other abnormalities. Next, a failure analysis specialized for the suspected part corresponding to the estimated abnormality is executed. Here, when the location and cause of the failure can be located, the failure analysis for the built-in RAM ends. On the other hand, when the location or cause of the failure is unknown, since there is a high possibility that the failure resides in a part other than the estimated part, the failure part is estimated again, and the failure analysis is performed with another part as the suspected part. When the location and cause of the failure are unknown even after performing the failure analysis on all parts, it is determined that there is no failure in the built-in RAM. Furthermore, when the location of the failure is not located also in a block other than the built-in RAM, the analysis is regarded as impracticable or unsuccessful.

Here, the data abnormality in the built-in RAM is detected as an abnormality in reading or writing data on the built-in RAM. The following are conceivable causes of abnormalities in reading and writing data on the built-in RAM. One is when a new defect has occurred in the memory cell array. Another is when a failure has occurred in the memory cell relief circuit, and the replaced defective memory cell is no longer replaced. Both of these two cause the occurrence of abnormalities in reading and writing data on the built-in RAM.

In this manner, when a data abnormality has occurred, it is supposed that the memory cell array and the memory cell relief circuit have failed as the corresponding parts. Accordingly, it is confirmed from the manufacturing data of the LSI whether or not the memory cell relief for the built-in RAM has been performed. Then, when the memory cell relief for the built-in RAM has been performed, the BIT number of the relieved memory cell is located. Next, the failure analysis for the memory cell array is performed. This is because the memory cell array tends to have a higher failure occurrence rate than other parts due to being finer and having a higher density. When the location and cause of the failure are unknown even after performing the failure analysis on the memory cell array, the failure analysis for the memory cell relief circuit is performed next.

Note that, as a memory cell fault tolerance technique, there is a technique that performs a test for determining whether or not a data line shift circuit and an input/output circuit are normal, depending on whether or not an output according to a data input signal that has been given is observed as a data output signal. Japanese Laid-open Patent Publication No. 2003-68093 is disclosed as related art.

SUMMARY

According to an aspect of the embodiments, a semiconductor device including a plurality of built-in memories, wherein each of the built-in memories includes: a plurality of memory cells; a selector circuit that connects a selected memory cell among the memory cells to an outside; a memory cell relief circuit that, when a fault has occurred in one of the memory cells, transmits, to the selector circuit, a relief signal configured to connect a normal memory cell to the outside without connecting the one of the memory cells in which the fault has occurred, to the outside, and switches selection in the selector circuit; and an abnormality detection circuit that performs abnormality detection for the memory cell relief circuit, based on a temporal change in the relief signal output from the memory cell relief circuit.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 6 is a diagram illustrating an operation of the abnormality detection circuit;

DESCRIPTION OF EMBODIMENTS

In recent years, in the LSI, each block such as an input/output (I/O) circuit and a logic circuit has become remarkably complicated, and the capacity of the built-in RAM has been remarkably extended, in order to cope with higher speed and higher functionality. Additionally, as the capacity of the built-in RAM is extended, the area occupied by the built-in RAM in the LSI is enlarged, and the occurrence of failures in the built-in RAM is increasing. Furthermore, the yield is decreasing as the capacity is extended, and the memory cell relief is carried out a large number of times in order to improve the yield. As a consequence, the failure of the memory cell relief circuit itself of the built-in RAM is also increasing.

In the past, when a data abnormality occurred in the built-in RAM, the cause mainly existed in the memory cell array, and in most cases, the analysis was ended by failure analysis for the memory cell array. However, in recent years, as described above, a large number of cases have been caused by the memory cell relief circuit, and increases in man-hours and time for isolation have become a problem. It has been thus desired to facilitate the isolation of the cause of failure in the built-in RAM.

In this regard, for example, even when a past technique of giving a data input signal and observing an output according to the given data input signal as a data output signal to test a data line is used, a malfunction of the data line can be found, but it is difficult to isolate the cause of a failure involving the memory cell relief circuit.

The disclosed technique has been made in view of the foregoing, and an object of the disclosed technique is to provide a semiconductor device and a semiconductor device control method that facilitate failure analysis in the built-in RAM.

Embodiments of a semiconductor device and a semiconductor device control method disclosed in the present application will be described in detail below with reference to the drawings. Note that the following embodiments do not limit the semiconductor device and the semiconductor device control method disclosed in the present application.

Figure 1:
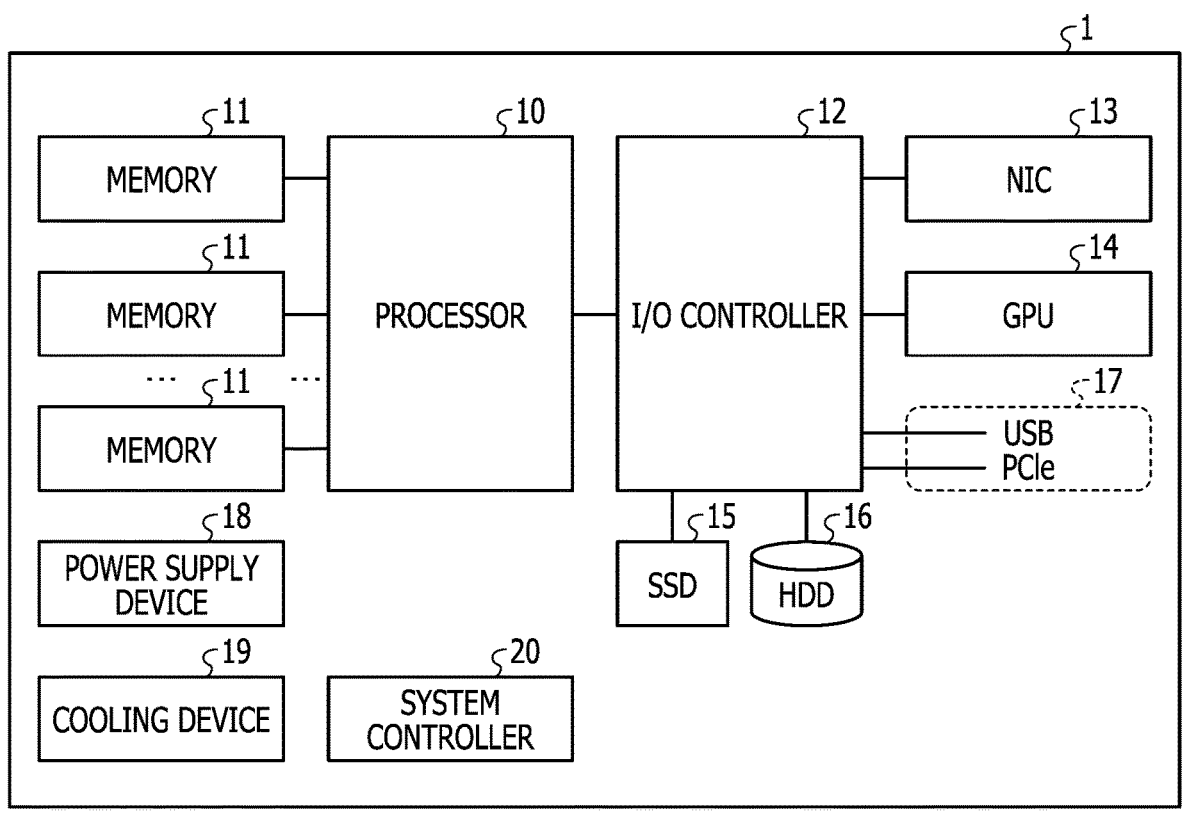
FIG. 1 is a configuration diagram of an information processing device.

[First Embodiment] FIG. 1 is a configuration diagram of an information processing device. The information processing device 1 includes a processor 10, memories 11, an I/O controller 12, a network interface controller (NIC) 13, and a graphic processing unit (GPU) 14. Furthermore, the information processing device 1 includes a solid state drive (SSD) 15, a hard disk drive (HDD) 16, an external connection port 17, a power supply device 18, a cooling device 19, and a system controller 20.

The I/O controller 12 relays the transfer of data between the processor 10 and another device. For example, the NIC 13, the GPU 14, the SSD 15 and the HDD 16 are connected to the I/O controller 12. In addition, the I/O controller 12 includes the external connection port 17. A universal serial bus (USB) device or a peripheral component interconnect express (PCIe) device is connected to the external connection port 17.

The processor 10 is a central processing unit (CPU) and is connected to the memories 11 and the I/O controller 12. The processor 10 transmits and receives data to and from the NIC 13, the GPU 14, the SSD 15, the HDD 16, and the like via the I/O controller 12. In addition, the processor 10 reads, for example, a program stored in the HDD 16 and expands the program in the memory 11 to execute the program.

The NIC 13 is an interface for communicating with an external device. The GPU 14 executes calculation processing specified by the processor 10. The SSD 15 and the HDD 16 are auxiliary storage devices and store various sorts of programs and data.

The power supply device 18 supplies electric power to each unit such as the processor 10 and the memories 11. The cooling device 19 circulates air to lower the temperature inside the information processing device 1. The system controller 20 comprehensively manages the entire system of the information processing device 1, including the drive speed of the cooling device 19 and the power supply amount of the power supply device 18.

Figure 2:
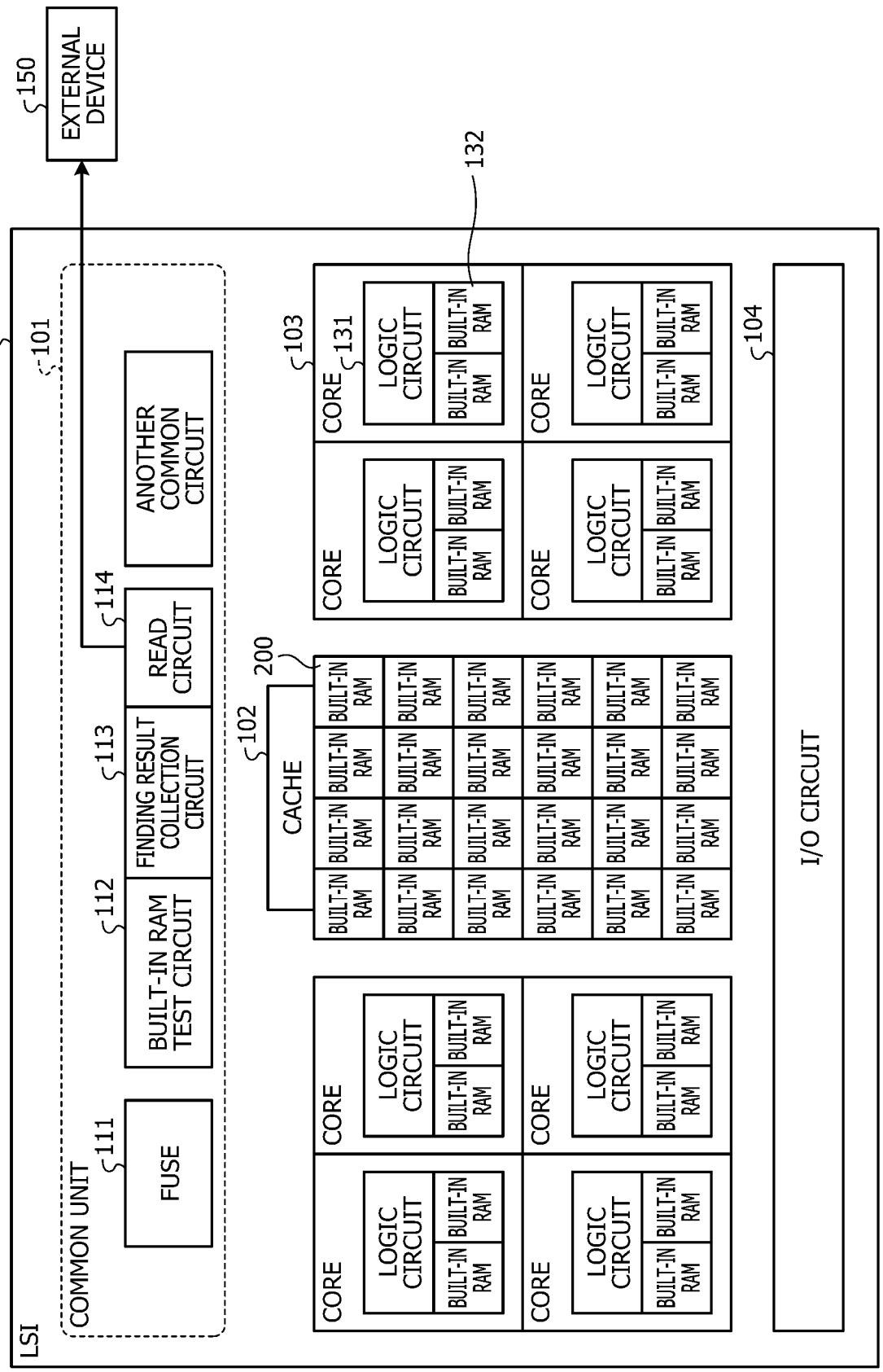
FIG. 2 is a block diagram of LSI.

FIG. 2 is a block diagram of LSI. The LSI 100 is a semiconductor device and is, for example, hardware that implements the processor 10 and the GPU 14 in FIG. 1. In the following explanation, the LSI 100 that implements the processor 10 will be described as an example. As illustrated in FIG. 2, the LSI 100 includes a common unit 101, a cache 102, cores 103, and an I/O circuit 104.

The common unit 101 has various functions commonly used by all the cores 103, the cache 102, and the like. For example, the common unit 101 includes a fuse 111, a built-in RAM test circuit 112, a finding result collection circuit 113, and a read circuit 114. The common unit 101 may also additionally include a common circuit commonly used by the cores 103, the cache 102, and the like.

The fuse 111 is a nonvolatile storage element. The fuse 111 stores a relief address indicating the position of the defective memory cell obtained in a test at the time of shipment. The fuse 111 may store the relief address by rewriting a held register or may store the relief address by being physically burned with the relief address.

The built-in RAM test circuit 112 is a self-diagnosis circuit called a BIST circuit. The built-in RAM test circuit 112 generates a test pattern and uses the generated test pattern to test a built-in RAM 132 of the core 103 and a built-in RAM 200 of the cache 102. Then, the built-in RAM test circuit 112 collates the test result with the expected value to locate the defective memory cell. Thereafter, the built-in RAM test circuit 112 stores the relief address indicating the position of the located defective memory cell, in the fuse 111.

The finding result collection circuit 113 collects the result of abnormality detection in each of the built-in RAMs 132 of the core 103 and the built-in RAMs 200 of the cache 102. Then, the finding result collection circuit 113 holds the collected results of the abnormality detection.

The read circuit 114 reads, from the finding result collection circuit 113, the result of the abnormality detection in each of the built-in RAMs 132 of the core 103 and the built-in RAMs 200 of the cache 102 held by the finding result collection circuit 113 and outputs the read result to the external device 150.

The I/O circuit 104 relays the transmission and reception of data to and from the memories 11 and the I/O controller 12, for example, when the LSI 100 is the processor 10.

A plurality of the cores 103 is arranged inside the LSI 100. Each core 103 includes a logic circuit 131 and the built-in RAMs 132. Here, the core 103 includes two built-in RAMs 132. The logic circuit 131 is a circuit that executes calculation. The built-in RAM 132 is a data storing device used when the logic circuit 131 executes a calculation.

The cache 102 includes a plurality of the built-in RAMs 200. The built-in RAM 200 is a data storing device that stores data used when the logic circuit 131 in the core 103 executes a calculation. The built-in RAM 132 of the core 103 and the built-in RAM 200 of the cache 102 have similar functions. In the following, the built-in RAM 200 will be described as an example.

Figure 3:
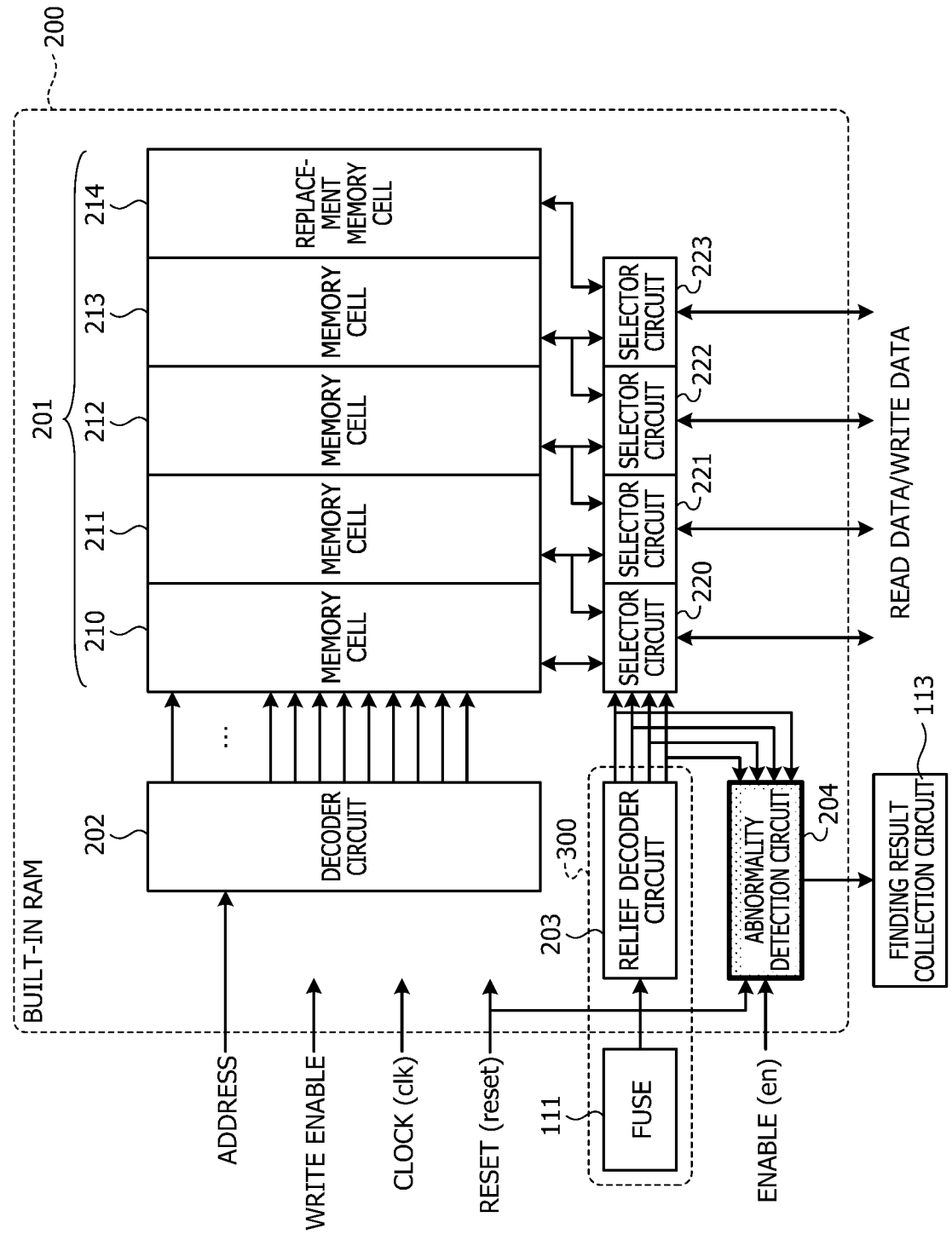
FIG. 3 is a block diagram of a built-in RAM according to a first embodiment.

FIG. 3 is a block diagram of the built-in RAM according to a first embodiment. Next, the details of the built-in RAM 200 according to the present embodiment will be described with reference to FIG. 3.

As illustrated in FIG. 3, the built-in RAM 200 according to the present embodiment includes a memory cell array 201, a decoder circuit 202, a relief decoder circuit 203, an abnormality detection circuit 204, and selector circuits 220 to 223.

The memory cell array 201 includes, for example, memory cells 210 to 213 and a replacement memory cell 214. The memory cells 210 to 213 and the replacement memory cell 214 are sets of unit memory cells to which the same BIT numbers are allocated among unit memory cells that are circuit components as minimum units for reading and writing data and retain information of 0 or 1. Here, the BIT number of the memory cell 210 is 0, the BIT number of the memory cell 211 is 1, the BIT number of the memory cell 212 is 2, the BIT number of the memory cell 213 is 3, and the BIT number of the replacement memory cell 214 is 4. The memory cells 210 to 213 are all used for reading and writing data unless a fault has occurred. The replacement memory cell 214 is used for reading and writing data as a replacement when a fault has occurred in any of the memory cells 210 to 213. In the following, the BIT numbers of 0 to 4 are sometimes represented as BIT 0 to 4, respectively. In addition, when the memory cells 210 to 213 and the replacement memory cell 214 are not distinguished from each other, the memory cells 210 to 213 and the replacement memory cell 214 are sometimes collectively referred to as "memory cells 21".

The decoder circuit 202 accepts the input of the address of the memory cell 21 as an access destination. Then, the decoder circuit 202 decodes the input address. Subsequently, the decoder circuit 202 transmits a signal to the memory cell 21 corresponding to the input address using the decoding result.

The selector circuits 220 to 223 are arranged in correspondence with the memory cells 210 to 213, respectively. The selector circuits 220 to 223 have connection paths for connecting to the corresponding memory cells 210 to 213, respectively. In addition, the selector circuits 220 to 223 have connection paths for connecting to the memory cells 211 to 213 or the replacement memory cell 214 arranged adjacent to the corresponding memory cells 210 to 213. Then, the selector circuits 220 to 223 are capable of selectively switching the connection paths to the corresponding memory cells 210 to 213 and the connection paths to the adjacent memory cells 211 to 213 and replacement memory cell 214. For example, the selector circuit 220 can select and connect to either the connection path to the memory cell 210 or the connection path to the memory cell 211. In addition, the selector circuit 223 can select and connect to either the connection path to the memory cell 213 or the connection path to the replacement memory cell 214.

The selector circuits 220 to 223 select their own connection paths in accordance with the decoded relief signal transmitted from the relief decoder circuit 203. For example, the decoded relief signal is a 4-bit signal, and the own selected paths of the selector circuits 220 to 223 are specified by the values of the zeroth to third bits, respectively. For example, the selector circuit 220 connects to the memory cell 210 when the zeroth bit of the decoded relief signal has 0. In addition, the selector circuit 220 connects to the memory cell 211 when the zeroth bit of the decoded relief signal has 1. Furthermore, for example, the selector circuit 223 connects to the replacement memory cell 214 when the third bit of the decoded relief signal has 1.

The relief decoder circuit 203, together with the fuse 111, is called a memory cell relief circuit 300. The relief decoder circuit 203 has connection paths that individually lead to each of the selector circuits 220 to 223. The relief decoder circuit 203 reads the relief address stored in the fuse 111 and decodes the read relief address to generate the decoded relief signal. Thereafter, the relief decoder circuit 203 outputs the values relevant to each of the selector circuits 220 to 223 in the decoded relief signal to the selector circuits 220 to 223, respectively. This decoded relief signal is relevant to an example of a "relief signal".

For example, when there is no defective memory cell, the relief decoder circuit 203 acquires a relief address representing no memory cell relief and generates a decoded relief signal in which the zeroth to third bits have "0000" to output "0" to each of the selector circuits 220 to 223. Consequently, the replacement memory cell 214 is not used, and the memory cells 210 to 213 are connected to the outside of the built-in RAM 200 via the selector circuits 220 to 223. In the following, the 4-bit decoded relief signal is sometimes represented by four values put in the order of bit numbers, such as "0000".

In addition, for example, a case where the memory cell 211 is a defective memory cell will be described. The relief decoder circuit 203 acquires a relief address that specifies the memory cell 211 as a defective memory cell, from the fuse 111 and decodes the acquired relief address to generate a decoded relief signal. When the memory cell 211 is a defective memory cell and is to be relieved, the relief decoder circuit 203 generates a decoded relief signal of "0111" such that the zeroth bit corresponding to the selector circuit 220 has 0 and the other bits have 1 and outputs the generated decoded relief signal. In response to this, the selector circuit 220 connects the memory cell 210 to the outside, and the selector circuits 221 to 223 connect the memory cells 212 to 213 and the replacement memory cell 214 to the outside, respectively. This causes the memory cell relief to function and suppresses the use of the memory cell 211, which is a defective memory cell.

The abnormality detection circuit 204 acquires the decoded relief signal output from the relief decoder circuit 203. Then, the abnormality detection circuit 204 detects an abnormality in the relief decoder circuit 203 using the decoded relief signal.

Figure 4:
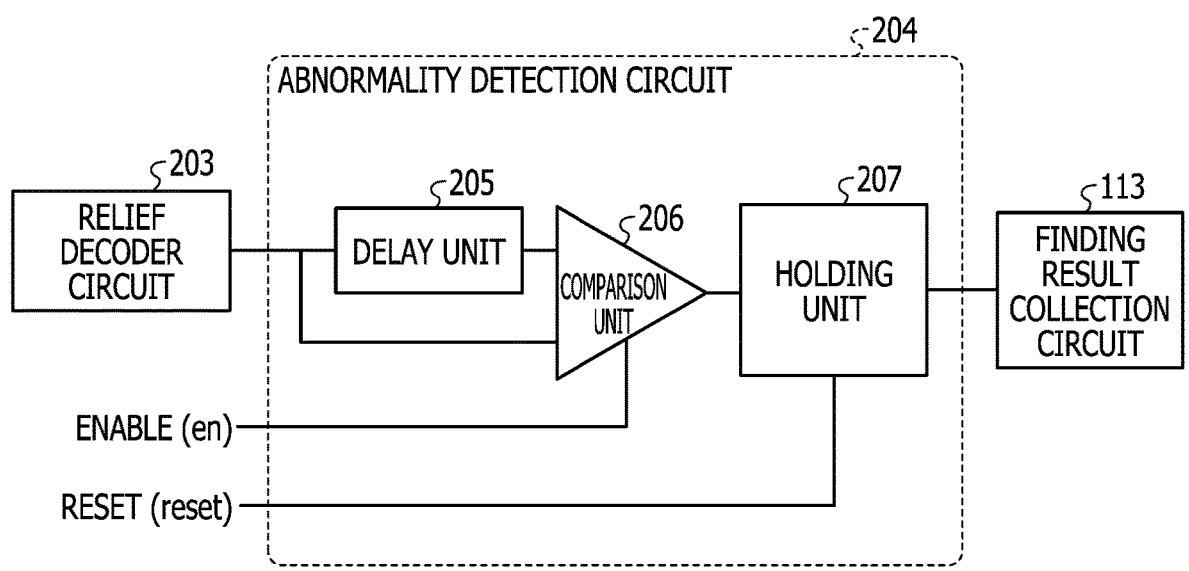
FIG. 4 is a block diagram representing a principle of an abnormality detection circuit.

FIG. 4 is a block diagram representing a principle of the abnormality detection circuit. The operating principle of the abnormality detection circuit 204 will be described with reference to FIG. 4. The abnormality detection circuit 204 includes a delay unit 205, a comparison unit 206, and a holding unit 207.

The delay unit 205 accepts the input of the decoded relief signal output from the relief decoder circuit 203. Then, the delay unit 205 delays the decoded relief signal and outputs the delayed decoded relief signal to the comparison unit 206.

The comparison unit 206 accepts the input of the decoded relief signal output from the relief decoder circuit 203. In addition, the comparison unit 206 accepts the input of a delayed decoded relief signal obtained by adding a delay to the decoded relief signal, from the delay unit 205. Furthermore, the comparison unit 206 accepts the input of an enable signal (en) from the logic circuit 131 or the like and starts comparison. For example, when the operation of the built-in RAM 200 starts, the enable signal to be input to the comparison unit 206 is turned on. When the enable signal has been turned on, the comparison unit 206 compares the decoded relief signal with the delayed decoded relief signal.

Here, since the decoded relief signal is designated by the relief address stored in the fuse 111, properly, the decoded relief signal has a value that does not change during the operation of the built-in RAM 200. However, when the decoded relief signal changes during the operation of the built-in RAM 200 due to some influence such as power supply noise or deterioration or the like of the memory cell relief circuit 300, the path selection of the selector circuits 220 to 223 is put into an erroneous state between before and after the change, and a data abnormality will occur.

Thus, if the decoded relief signal and the delayed decoded relief signal have the same value, the comparison unit 206 outputs a determination result indicating normality to the holding unit 207. On the other hand, when the decoded relief signal and the delayed decoded relief signal have different values, the comparison unit 206 outputs a determination result indicating an abnormality to the holding unit 207.

In this manner, the abnormality detection circuit 204 detects a change in the decoded relief signal during the operation of the built-in RAM 200 by detecting a change in the decoded relief signal in the time direction, which is a temporal change. If the value of the decoded relief signal is consistent, the value of the decoded relief signal and the value of the delayed decoded relief signal are the same. On the other hand, when a change has occurred in the decoded relief signal, the delayed decoded relief signal has a value before the change, during the delay time. Therefore, when a change in the decoded relief signal has occurred, the value of the decoded relief signal and the value of the delayed decoded relief signal do not match. Since unmatching occurs during the delay time, the holding unit 207 is provided as follows to hold the determination result indicating an abnormality when unmatching has happened even one time.

The holding unit 207 accepts the input of the signal output from the comparison unit 206. If the input of the determination result indicating normality continues from the comparison unit 206, the holding unit 207 outputs the determination result indicating normality to the finding result collection circuit 113. On the other hand, if the input from the comparison unit 206 is a determination result indicating an abnormality, the holding unit 207 outputs the determination result indicating an abnormality and, thereafter, maintains the output of the determination result indicating an abnormality, even if the input changes to the determination result indicating normality.

In addition, a reset signal is input to the holding unit 207 from the logic circuit 131 or the like. For example, a reset signal is input to the holding unit 207 at the time of initialization after fault handling has ended or after it has been confirmed that there is no fault. When accepting the input of the reset signal, the holding unit 207 returns the output to the determination result indicating normality.

In this manner, the abnormality detection circuit 204 regularly monitors the values of all the decoded relief signals. Then, the abnormality detection circuit 204 detects an abnormality in the memory cell relief circuit 300 in accordance with whether or not the decoded relief signal has changed. Subsequently, since the holding unit 207 keeps outputting the determination result indicating the abnormality from the time after the abnormality is detected until the time when the input of the reset signal is accepted, an administrator is allowed to confirm the fact that the abnormality in the memory cell relief circuit 300 has been detected, at any time during that time even if the fault has been recovered.

Figure 5:
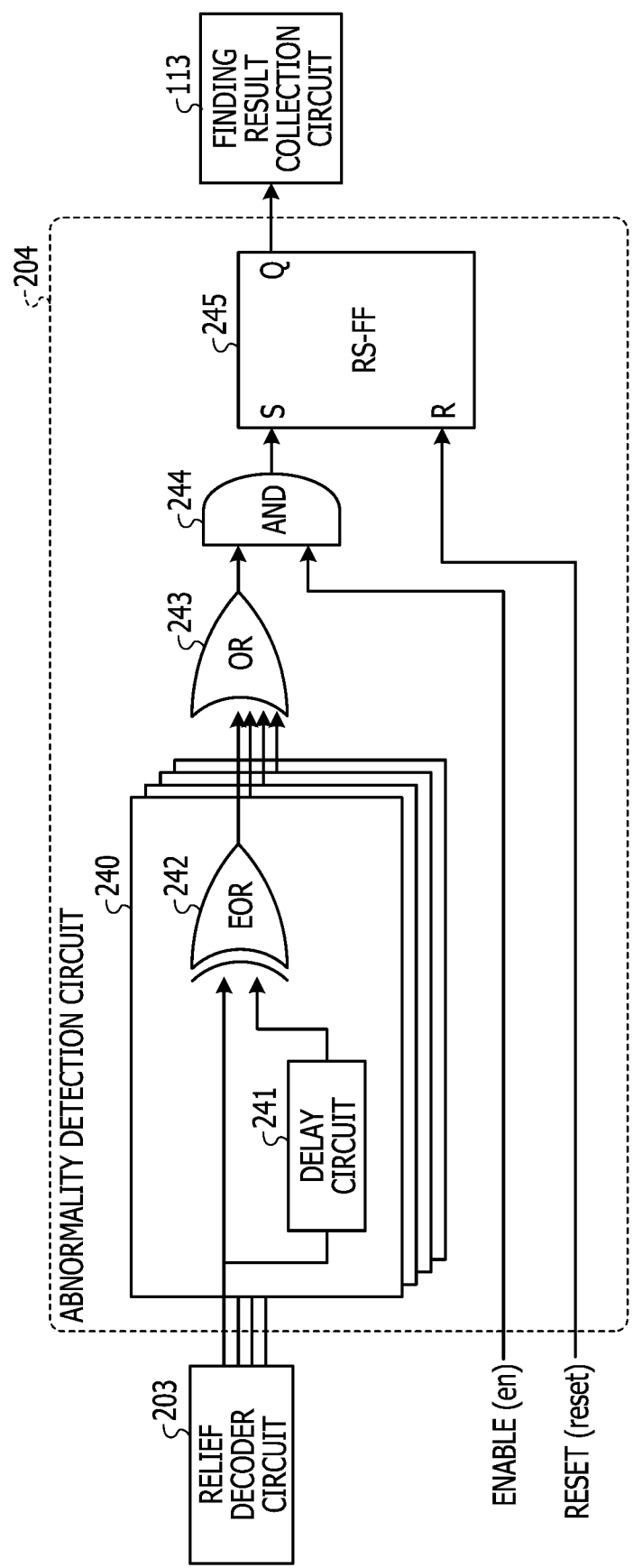
FIG. 5 is a circuit diagram of an abnormality detection circuit according to the first embodiment.

FIG. 5 is a circuit diagram of the abnormality detection circuit according to the first embodiment. Next, the details of the abnormality detection circuit 204 according to the present embodiment will be described with reference to FIG. 5. As illustrated in FIG. 5, the abnormality detection circuit 204 according to the present embodiment includes a comparison circuit 240, an OR circuit 243, an AND circuit 244, and a set reset-flip flop (RS-FF) 245.

A number of the comparison circuits 240 corresponding to each value of the decoded relief signal sent to each of the selector circuits 220 to 223 from the relief decoder circuit 203 are arranged. For example, when there are four selector circuits 220 to 223, four comparison circuits 240 are arranged so as to correspond to signals input to each of the selector circuits 220 to 223. The comparison circuit 240 includes a delay circuit 241 and an exclusive (E) OR circuit 242.

The delay circuit 241 accepts the input of the corresponding signal among the values of the decoded relief signal input to the selector circuits 220 to 223. Then, the delay circuit 241 gives a delay to the input signal. Thereafter, the delay circuit 241 outputs a delay input signal obtained by giving a delay to the input signal, to the EOR circuit 242. This delay circuit 241 is relevant to the delay unit 205 in FIG. 4.

The EOR circuit 242 accepts the input of an input signal similar to the input signal to the delay circuit 241. In addition, the EOR circuit 242 accepts the input of the delay input signal from the delay circuit 241. Then, the EOR circuit 242 outputs an exclusive OR of the input signal and the delay input signal. For example, the EOR circuit 242 outputs 0 when the value of the input signal and the value of the delay input signal match. On the other hand, when the value of the input signal and the value of the delay input signal do not match, the EOR circuit 242 outputs 1. Here, whether the decoded relief signal is normal when the value is fixed at 0 or is normal when the value is fixed at 1 can be freely assigned by setting. This EOR circuit 242 is relevant to the comparison unit 206 in FIG. 4.

The OR circuit 243 accepts the input of the signal output from the EOR circuit 242 of each comparison circuit 240. Then, the OR circuit 243 outputs a logical sum of all the signals that have been input. For example, the OR circuit 243 outputs 1 when the value of the input signal and the value of the delay input signal do not match even in one of the EOR circuits 242.

The AND circuit 244 accepts the input of the signal output from the OR circuit 243. In addition, the AND circuit 244 accepts the input of the enable signal. When the enable signal has been turned on, the AND circuit 244 outputs the signal acquired from the OR circuit 243 to the RS-FF 245.

When the reset signal is input, the RS-FF 245 alters a held value to 0 and outputs 0 through a Q terminal to the finding result collection circuit 113. Thereafter, the RS-FF 245 accepts the input of the signal output from the AND circuit 244 by way of an S terminal. Then, when the signal output from the AND circuit 244 changes to 1, the RS-FF 245 outputs 1 through the Q terminal. Thereafter, the RS-FF 245 maintains the output from the Q terminal at 1 even if the input to the S terminal becomes 0. This RS-FF 245 is relevant to the holding unit 207 in FIG. 4.

FIG. 6 is a diagram illustrating an operation of the abnormality detection circuit. When the reset signal is turned on at 1, the RS-FF 245 outputs 0. In addition, when the reset signal is turned off at 0 and the enable signal is turned off at 0, the RS-FF 245 holds the value.

Furthermore, when the reset signal is turned off at 0 and the enable signal is turned on at 1, if the decoded relief signal is normal and all the values have consistent values, there is no change in the time direction in each value of the decoded relief signal, and the values are consistent. Therefore, the output from the OR circuit 243 is given as 0. In this case, the RS-FF 245 holds the value. On the other hand, when there is an abnormality in the decoded relief signal and a value has changed, a change in the time direction in which 0 transforms into 1 or 1 transforms into 0 occurs in any of the values of the decoded relief signal. In that case, the OR circuit 243 outputs 1 during the delay time. At this time, in the RS-FF 245, since the held value becomes 1, the output becomes 1.

Figure 7:
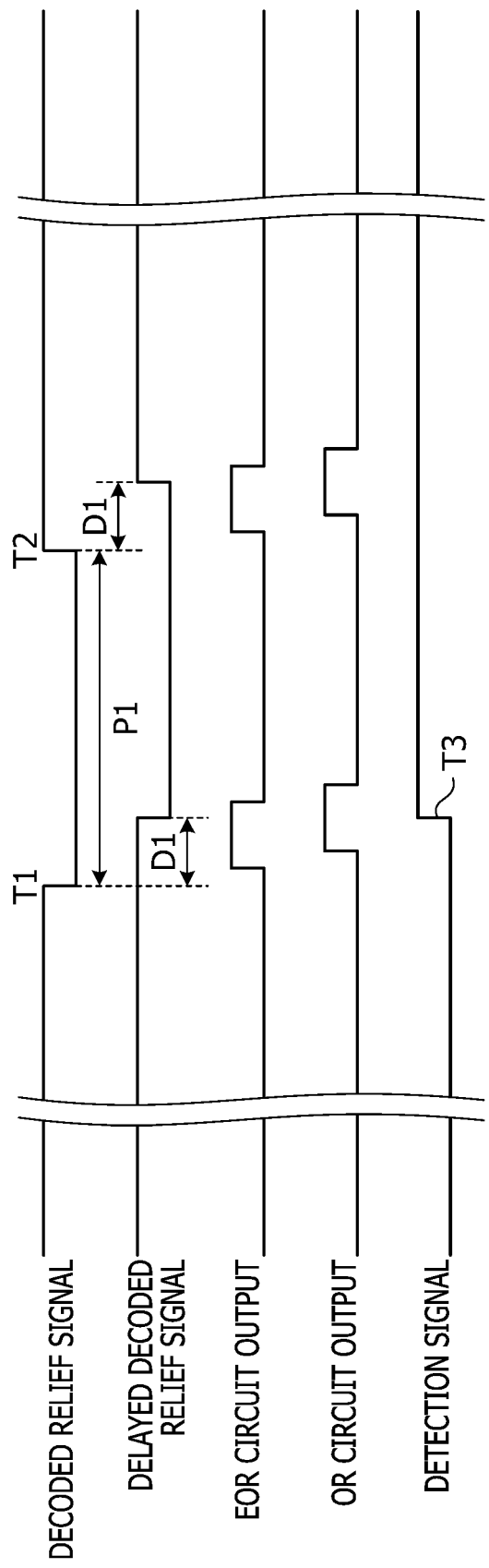
FIG. 7 is a timing chart of the abnormality detection circuit when a normal value is 1.

FIG. 7 is a timing chart of the abnormality detection circuit when a normal value is 1. Here, the decoded relief signal is normal when the values of the decoded relief signal are fixed at 1. Next, an operation of the abnormality detection circuit 204 when the normal value is 1 will be described with reference to FIG. 7. In FIG. 7, an input signal having the value of the decoded relief signal input to one comparison circuit 240 is represented as the decoded relief signal, and a signal obtained by delaying the input signal in the one comparison circuit 240 is represented as the delayed decoded relief signal. In addition, during the operation of the built-in RAM 200, the enable signal input to the AND circuit 244 is fixed at 1 and thus is omitted.

The decoded relief signal changes from the normal value of 1 to 0 at a time point T1, stays at 0 during a time P1, and thereafter returns to the normal value of 1 at a time point T2. In this case, the delay circuit 241 outputs a delayed decoded relief signal obtained by giving a delay time D1 to the decoded relief signal. Accordingly, the value of the delayed decoded relief signal to be input to the EOR circuit 242 stays at 1 from the time point T1 until the delay time D1 has elapsed. Since the EOR circuit 242 accepts the input of the decoded relief signal having a value of 0 and the delayed decoded relief signal having a value of 1 at the time point T1, the value of the signal to be output changes from 0 to 1, and thereafter the EOR circuit 242 outputs a signal having a value of 1 until the delay time D1 has elapsed. The OR circuit 243 accepts the input of the signal having a value of 1 from the EOR circuit 242, which changes the value of the signal to be output from 0 to 1, and thereafter outputs a signal having a value of 1 until the delay time D1 has elapsed. Since the AND circuit 244 has accepted the input of the enable signal having a value of 1, the value of the signal to be output stays at 1 while accepting the input of the signal having a value of 1 from the OR circuit 243. The RS-FF 245 holds a value of 1 because the input to an R terminal is 0. Consequently, the value of the detection signal collected by the finding result collection circuit 113 changes from 0 to 1 at a time point T3.

Thereafter, until the time point T2, the values of the decoded relief signal and the delayed decoded relief signal input to the EOR circuit 242 are both 0, such that the EOR circuit 242 outputs a signal having a value of 0. During this time, the OR circuit 243 and the AND circuit 244 also output a signal having a value of 0. The RS-FF 245 holds a value of 1. Therefore, the value of the detection signal collected by the finding result collection circuit 113 is maintained at 1.

Next, when the time point T2 is reached, the value of the decoded relief signal to be input to the EOR circuit 242 changes to 1, but the value of the delayed decoded relief signal stays at 0. Therefore, in the EOR circuit 242, the value of the signal to be output is changed from 0 to 1. Thereafter, the EOR circuit 242 outputs a signal having a value of 1 until the delay time D1 has elapsed. The OR circuit 243 accepts the input of the signal having a value of 1 from the EOR circuit 242, which changes the value of the signal to be output from 0 to 1, and thereafter outputs a signal having a value of 1 until the delay time D1 has elapsed. Since the AND circuit 244 has accepted the input of the enable signal having a value of 1, the value of the signal to be output stays at 1 while accepting the input of the signal having a value of 1 from the OR circuit 243. During this time, the RS-FF 245 holds a value of 1 because the input to the R terminal is 0. Therefore, the value of the detection signal collected by the finding result collection circuit 113 is maintained at 1.

Thereafter, the values of the decoded relief signal and the delayed decoded relief signal input to the EOR circuit 242 both become 1, and the EOR circuit 242 outputs a signal having a value of 0. At this time, the OR circuit 243 and the AND circuit 244 also output a signal having a value of 0. The RS-FF 245 holds a value of 1. Therefore, the value of the detection signal collected by the finding result collection circuit 113 is maintained at 1. This means that the value of the detection signal collected by the finding result collection circuit 113 is maintained at 1 after the time point T3.

Figure 8:
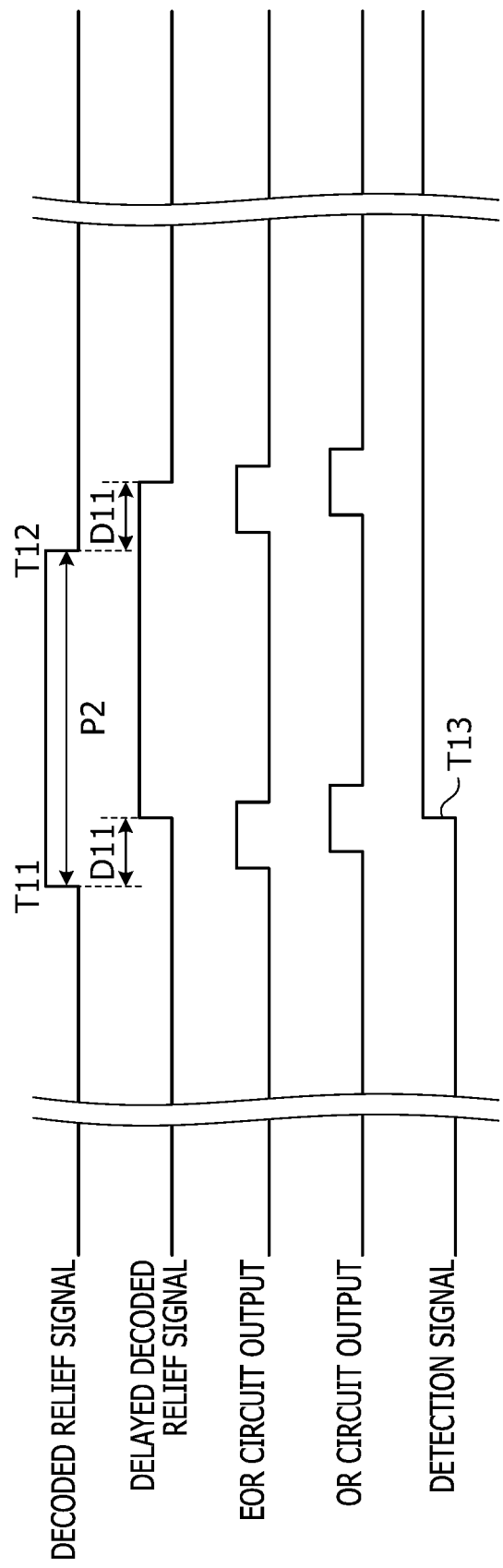
FIG. 8 is a timing chart of the abnormality detection circuit when a normal value is 0.

FIG. 8 is a timing chart of the abnormality detection circuit when a normal value is 0. Here, the decoded relief signal is normal when the value of the decoded relief signal is fixed at 0. Next, an operation of the abnormality detection circuit 204 when the normal value is 0 will be described with reference to FIG. 8.

The decoded relief signal changes from the normal value of 0 to 1 at a time point T11, stays at 1 during a time P2, and thereafter returns to the normal value of 0 at a time point T12. In this case, the delay circuit 241 outputs a delayed decoded relief signal obtained by giving a delay time D11 to the decoded relief signal. Accordingly, the value of the delayed decoded relief signal to be input to the EOR circuit 242 stays at 0 from the time point T11 until the delay time D11 has elapsed. Since the EOR circuit 242 accepts the input of the decoded relief signal having a value of 1 and the delayed decoded relief signal having a value of 0 at the time point T11, the value of the signal to be output changes from 0 to 1, and thereafter the EOR circuit 242 outputs a signal having a value of 1 until the delay time D11 has elapsed. The OR circuit 243 accepts the input of the signal having a value of 1 from the EOR circuit 242, which changes the value of the signal to be output from 0 to 1, and thereafter outputs a signal having a value of 1 until the delay time D11 has elapsed. Since the AND circuit 244 has accepted the input of the enable signal having a value of 1, the value of the signal to be output stays at 1 while accepting the input of the signal having a value of 1 from the OR circuit 243. The RS-FF 245 holds a value of 1 because the input to the R terminal is 0. Consequently, the value of the detection signal collected by the finding result collection circuit 113 changes from 0 to 1 at a time point T13.

Thereafter, until the time point T12, the values of the decoded relief signal and the delayed decoded relief signal input to the EOR circuit 242 are both 1, such that the EOR circuit 242 outputs a signal having a value of 0. During this time, the OR circuit 243 and the AND circuit 244 also output a signal having a value of 0. The RS-FF 245 holds a value of 1. Therefore, the value of the detection signal collected by the finding result collection circuit 113 is maintained at 1.

Next, when the time point T12 is reached, the value of the decoded relief signal to be input to the EOR circuit 242 changes to 0, but the value of the delayed decoded relief signal stays at 1. Therefore, in the EOR circuit 242, the value of the signal to be output is changed from 0 to 1. Thereafter, the EOR circuit 242 outputs a signal having a value of 1 until the delay time D11 has elapsed. The OR circuit 243 accepts the input of the signal having a value of 1 from the EOR circuit 242, which changes the value of the signal to be output from 0 to 1, and thereafter outputs a signal having a value of 1 until the delay time D11 has elapsed. Since the AND circuit 244 has accepted the input of the enable signal having a value of 1, the value of the signal to be output stays at 1 while accepting the input of the signal having a value of 1 from the OR circuit 243. During this time, the RS-FF 245 holds a value of 1 because the input to the R terminal is 0. Therefore, the value of the detection signal collected by the finding result collection circuit 113 is maintained at 1.

Thereafter, the values of the decoded relief signal and the delayed decoded relief signal input to the EOR circuit 242 both become 0, and the EOR circuit 242 outputs a signal having a value of 0. At this time, the OR circuit 243 and the AND circuit 244 also output a signal having a value of 0. The RS-FF 245 holds a value of 1. Therefore, the value of the detection signal collected by the finding result collection circuit 113 is maintained at 1. This means that the value of the detection signal collected by the finding result collection circuit 113 is maintained at 1 after the time point T13.

Figure 9:
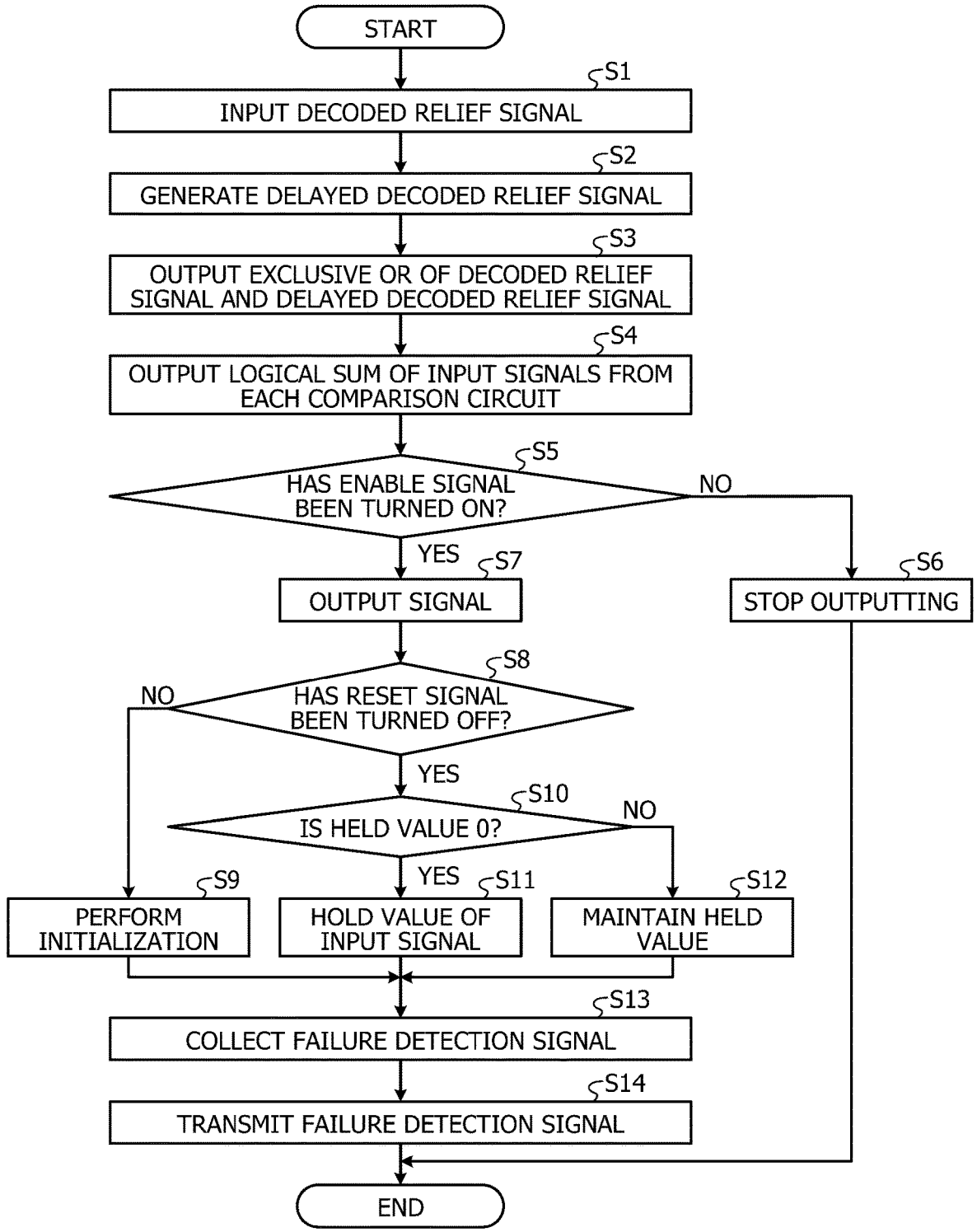
FIG. 9 is a flowchart of an abnormality detection process for a memory cell relief circuit according to the first embodiment.

FIG. 9 is a flowchart of an abnormality detection process for the memory cell relief circuit according to the first embodiment. Next, a flow of the abnormality detection process for the memory cell relief circuit 300 according to the present embodiment will be described with reference to FIG. 9.

The abnormality detection circuit 204 accepts the input of a decoded relief signal from the relief decoder circuit 203 (step S1). At this time, in each comparison circuit 240, the values input to each of the corresponding selector circuits 220 to 223 are input as the decoded relief signal.

The delay circuit 241 of each comparison circuit 240 appends a delay to the input decoded relief signal to generate a delayed decoded relief signal (step S2).

The EOR circuit 242 of each comparison circuit 240 accepts the input of the decoded relief signal and the delayed decoded relief signal. Then, the EOR circuit 242 of each comparison circuit 240 outputs the exclusive OR of the decoded relief signal and the delayed decoded relief signal (step S3).

In the OR circuit 243, the exclusive OR of the decoded relief signal and the delayed decoded relief signal is input as an input signal from each comparison circuit 240. Then, the OR circuit 243 outputs the logical sum of the input signals from each comparison circuit 240 (step S4).

The AND circuit 244 accepts the input of the logical sum of the input signals from each comparison circuit 240 output from the OR circuit 243. Then, the AND circuit 244 determines whether or not the enable signal has been turned on, depending on whether the enable signal has 1 or 0 (step S5).

When the enable signal has 0 and has been turned off (step S5: negative), the AND circuit 244 stops outputting the signal (step S6). In this case, since the built-in RAM 200 is not operating, the abnormality detection process for the memory cell relief circuit 300 ends.

On the other hand, when the enable signal has 1 and has been turned on (step S5: affirmative), the AND circuit 244 outputs the input signal from the OR circuit 243 (step S7).

The RS-FF 245 accepts the input of the signal output from the AND circuit 244. Then, the RS-FF 245 determines whether or not the reset signal has been turned off, depending on whether the reset signal has 0 or 1 (step S8). When the reset signal has 1 and has been turned on (step S8: negative), the RS-FF 245 performs initialization and alters the held value to 0 (step S9).

On the other hand, when the reset signal has 0 and has been turned off (step S8: affirmative), the RS-FF 245 determines whether or not the held value is 0 (step S10).

When the held value is 0 (step S10: affirmative), the RS-FF 245 holds the value of the input signal (step S11). For example, if the value of the input signal is 0, the RS-FF 245 remains holding 0 and, if the value of the input signal is 1, the RS-FF 245 alters the held value to 1.

On the other hand, when the held value is 1 (step S10: negative), the RS-FF 245 maintains the held value at 1 as it is (step S12).

The finding result collection circuit 113 periodically collects an abnormality detection signal output from each abnormality detection circuit 204 of each built-in RAM 200 (step S13).

The read circuit 114 reads the abnormality detection signal output from each abnormality detection circuit 204 of each built-in RAM 200 from the finding result collection circuit 113 in accordance with an acquisition request for the abnormality detection signal from the external device 150 and transmits the read abnormality detection signal to the external device 150 (step S14).

Figure 10:
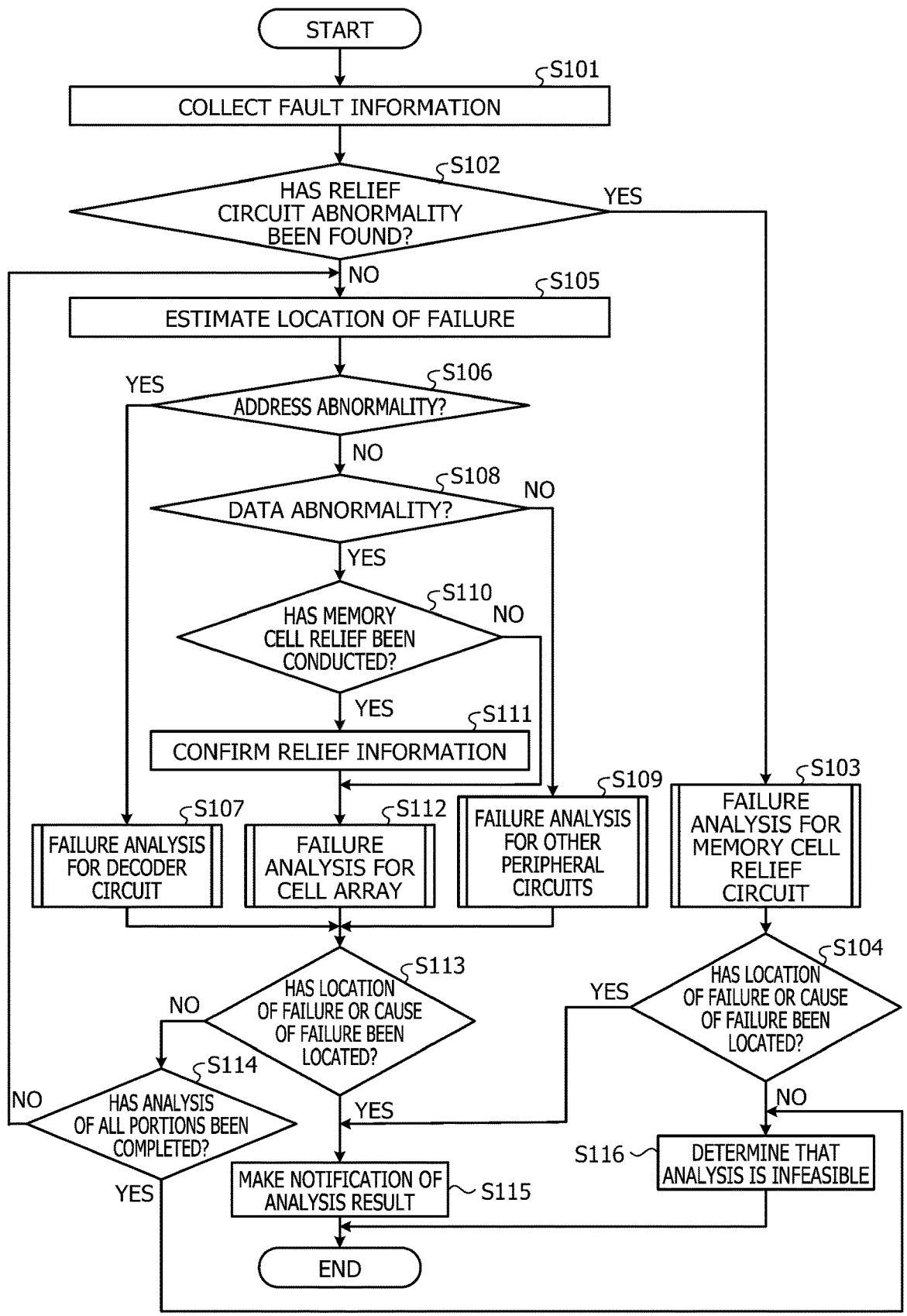
FIG. 10 is a flowchart of built-in RAM failure analysis according to the first embodiment.

FIG. 10 is a flowchart of built-in RAM failure analysis according to the first embodiment. Next, a flow of a failure analysis process for the built-in RAM 200 according to the present embodiment will be described with reference to FIG. 10.

The finding result collection circuit 113 collects the abnormality detection signal output from the abnormality detection circuit 204 built in the built-in RAM 200. An operator who analyzes a failure collects fault information on the built-in RAM 200 using the external device 150 (step S101). At this time, the external device 150 acquires the collected abnormality detection signals from the read circuit 114.

The administrator refers to the collected abnormality detection signals to determine whether or not a relief circuit abnormality representing an abnormality in the memory cell relief circuit 300 has been found (step S102).

When an abnormality in the memory cell relief circuit 300 has been found (step S102: affirmative), the operator executes failure analysis for the memory cell relief circuit 300 (step S103).

The operator determines whether or not the location of the failure or the cause of the failure has been successfully located by the failure analysis for the memory cell relief circuit 300 (step S104). When the location of the failure or the cause of the failure has been successfully located (step S104: affirmative), the failure analysis process for the built-in RAM 200 proceeds to step S115.

On the other hand, when the location of the failure or the cause of the failure is unknown (step S104: negative), the operator concludes the location of the failure and the cause of the failure as unknown. Then, the failure analysis process for the built-in RAM 200 proceeds to step S116.

Meanwhile, when an abnormality in the memory cell relief circuit 300 has not been found (step S102: negative), the operator executes estimation of the location of the failure from the collected fault information (step S105).

Then, the operator determines whether or not an address abnormality has occurred, depending on the estimation of the location of the failure (step S106). When an address abnormality has occurred (step S106: affirmative), the operator executes failure analysis for the decoder circuit 202 (step S107). Thereafter, the failure analysis process for the built-in RAM 200 proceeds to step S113.

On the other hand, when no address abnormality has occurred (step S106: negative), the operator determines whether or not a data abnormality has occurred (step S108). When no data abnormality has occurred (step S108: negative), the operator executes failure analysis for other peripheral circuits (step S109). Thereafter, the failure analysis process for the built-in RAM 200 proceeds to step S113.

On the other hand, when a data abnormality has occurred (step S108: affirmative), the operator determines whether or not memory cell relief has been performed (step S110). When the memory cell relief has not been performed (step S110: negative), the failure analysis process for the built-in RAM 200 proceeds to step S112.

On the other hand, when the memory cell relief has been performed (step S110: affirmative), the operator confirms relief information (step S111).

Then, the operator executes failure analysis for the memory cell array 201 (step S112). Thereafter, the failure analysis process for the built-in RAM 200 proceeds to step S113.

Subsequently, the operator determines whether or not the location of the failure or the cause of the failure has been successfully located by each kind of failure analysis (step S113). When the location of the failure or the cause of the failure has been successfully located (step S113: affirmative), the failure analysis process for the built-in RAM 200 proceeds to step S115.

On the other hand, when the location of the failure and the cause of the failure are unknown (step S113: negative), the operator determines whether or not the analysis of all the portions of the built-in RAM 200 has been completed (step S114). When there is still a portion that has not been analyzed (step S114: negative), the failure analysis process for the built-in RAM 200 returns to step S105.

On the other hand, when the analysis of all the portions has been completed (step S114: affirmative), the operator concludes the location of the failure and the cause of the fault as unknown. Then, the failure analysis process for the built-in RAM 200 proceeds to step S116.

When the location of the failure or the cause of the failure has been located (step S104: affirmative), the operator notifies the administrator or the like of the information processing device 1 of the analysis result (step S115).

In addition, when the location of the failure and the cause of the failure are unknown (step S104: negative), the operator determines that analysis is infeasible (step S116). In this manner, by confirming the abnormality detection signal, the operator is allowed to immediately determine whether or not an abnormality has occurred in the memory cell relief circuit 300 and to easily isolate the location of the failure.

Figure 11:
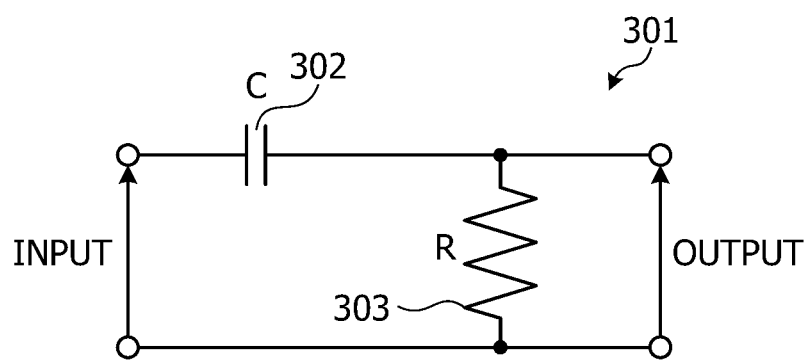
FIG. 11 is a diagram illustrating another method for finding a signal change.

Here, in the present embodiment, the signal change is found by the digital circuit that gives a delay, but the signal change may also be found by another method. FIG. 11 is a diagram illustrating another method for finding the signal change. For example, an ordinary differentiating circuit 301 including a capacitor 302 and a resistor 303 as illustrated in FIG. 11 may be used as the comparison circuit 240. In the differentiating circuit 301, a pulse is produced at the output when the input signal changes. The abnormality detection circuit 204 may also use the pulse produced by the differentiating circuit 301 to perform failure detection using a change in a signal.

Furthermore, in the present embodiment, the abnormality detection signal is collected by the finding result collection circuit 113 arranged in the common unit 101 of the LSI 100 and transmitted to the external device 150 by the read circuit 114, but another method may also be used as the collection method for the abnormality detection signal. For example, the abnormality detection signal may also be output directly to the external device 150. Thus, another collection method for the abnormality detection signal will be described.

Figure 12:
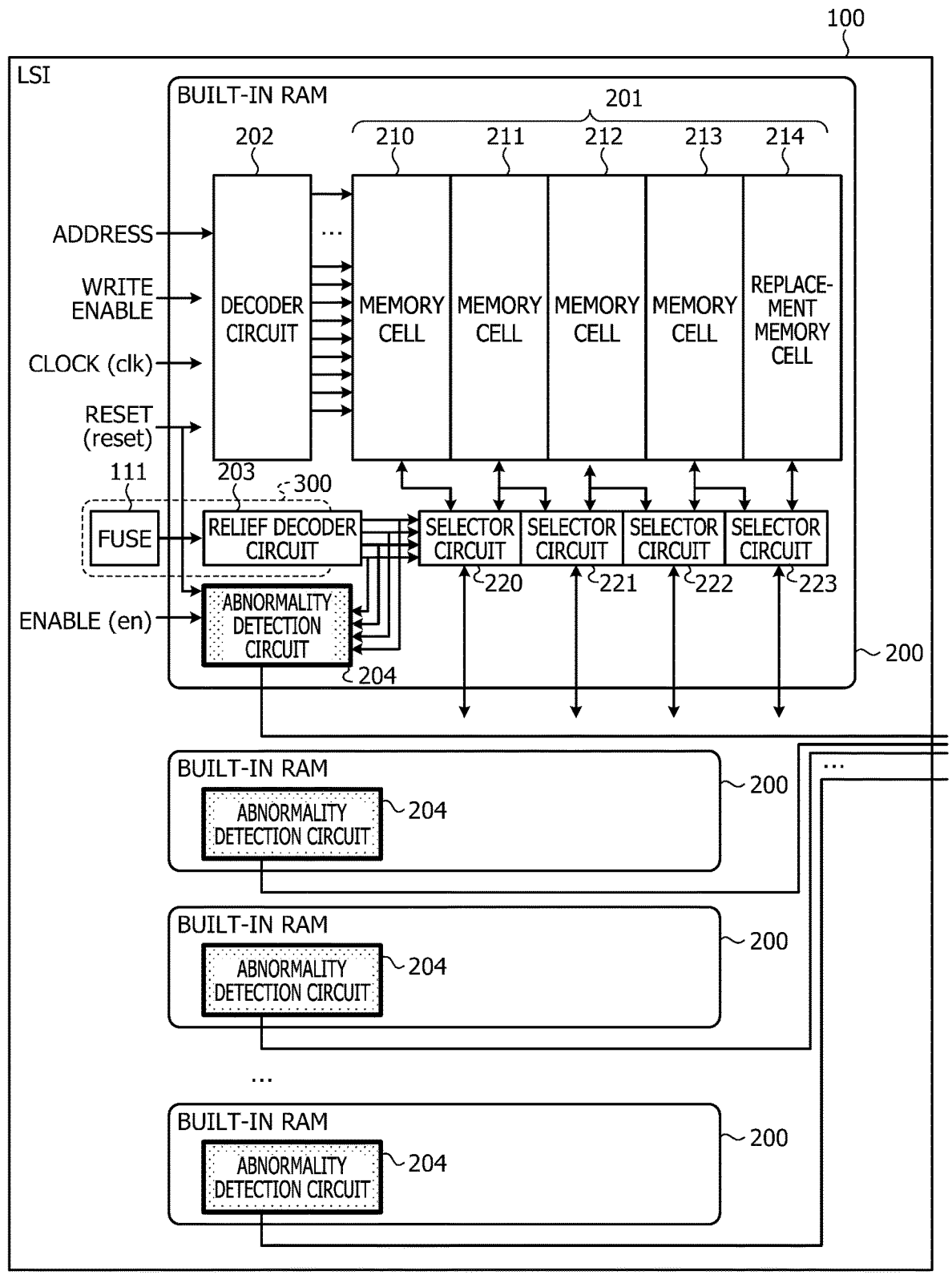
FIG. 12 is a diagram for explaining an example of an abnormality detection signal collection method according to the first embodiment.

FIG. 12 is a diagram for explaining an example of an abnormality detection signal collection method according to the first embodiment. In the case of the configuration illustrated in FIG. 12, the abnormality detection signals of the respective built-in RAMs 200 are directly output to the external device 150 individually from each other. In this case, the external device 150 can read the abnormality detection signals at the same time, but a number of terminals equal to the number of the built-in RAMs 200 are provided to extract the abnormality detection signals.

Figure 13:
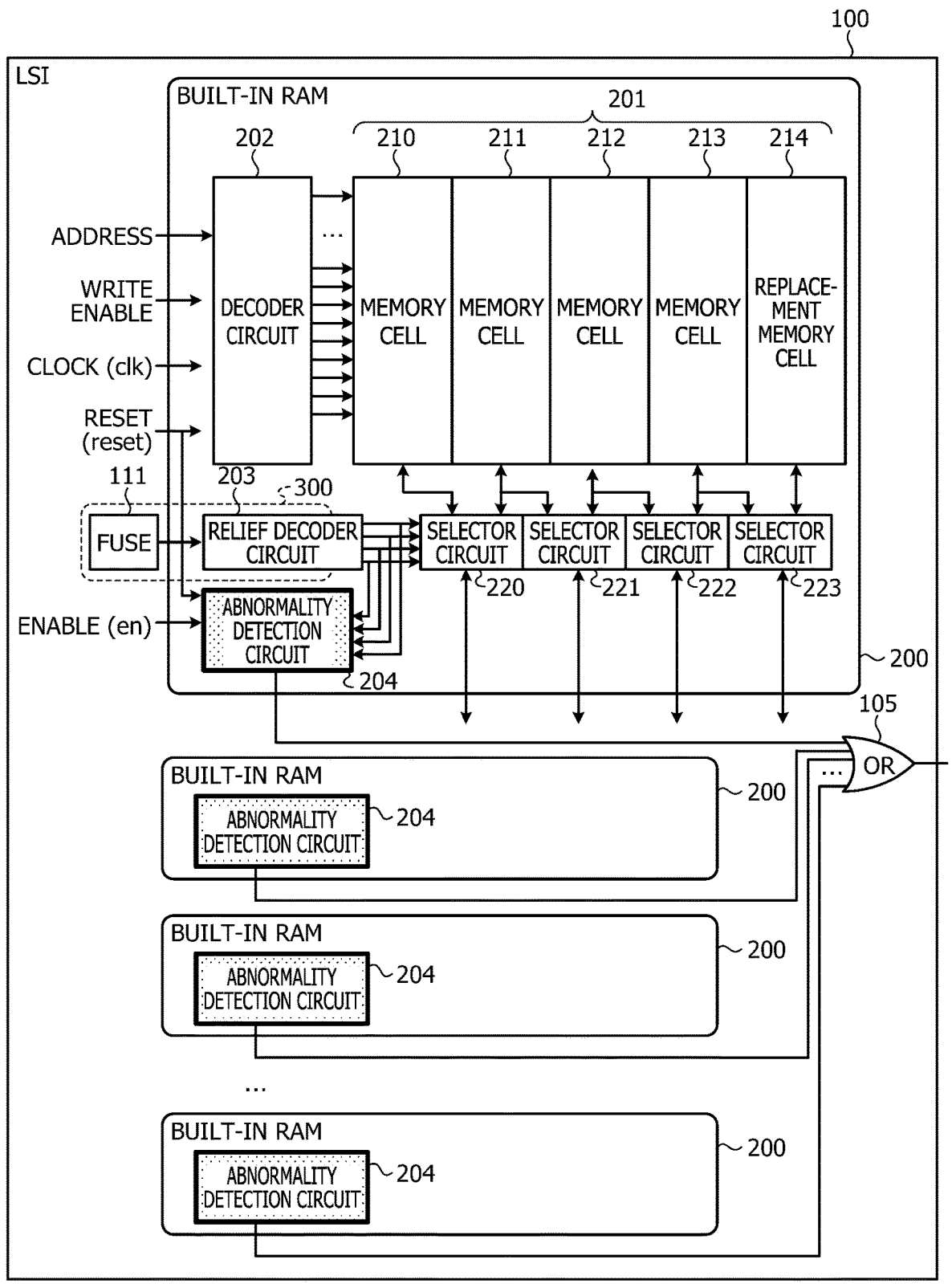
FIG. 13 is a diagram for explaining another example of the abnormality detection signal collection method according to the first embodiment.

FIG. 13 is a diagram for explaining another example of the abnormality detection signal collection method according to the first embodiment. In the case of the configuration illustrated in FIG. 13, the abnormality detection signals of a plurality of built-in RAMs 200 are gathered by the OR circuit 105, and the logical sum of the respective abnormality detection signals is output. This may reduce the number of terminals for extracting the abnormality detection signals to one. For example, when an abnormality has been detected in any of the plurality of built-in RAMs 200 arranged in the LSI 100, the OR circuit 105 outputs the detected abnormality as information on the abnormality of whole built-in RAMs 200. This OR circuit 105 is relevant to an example of an "information aggregation circuit".

In the case of this configuration, it is difficult to distinguish which built-in RAM 200 has an abnormality that has been detected. However, since the probability that a plurality of built-in RAMs will have a data abnormality at the same time is usually very low, it is not problematic for the operator to deem that an abnormality has been found in the memory cell relief circuit 300 of the built-in RAM 200 that has the data abnormality. In addition, the configuration in FIG. 13 may also be used when outputting the abnormality detection signal to the finding result collection circuit 113.

As described above, the built-in RAM according to the present embodiment detects a failure of the memory cell relief circuit by finding a change in the decoded relief signal output from the relief decoder circuit. Then, information that the failure was once detected is maintained until the reset is performed. This allows the operator who performs failure analysis to immediately determine whether or not an abnormality has occurred in the memory cell relief circuit when an abnormality has occurred in the built-in RAM and to quickly isolate the location of the failure as to whether the memory cell relief circuit has an abnormality or a portion other than the memory cell relief circuit has an abnormality. Then, if the memory cell relief circuit has an abnormality, the operator only needs to perform the failure analysis narrowly on the memory cell relief circuit, which facilitates the failure analysis in the built-in RAM.

Figure 14:
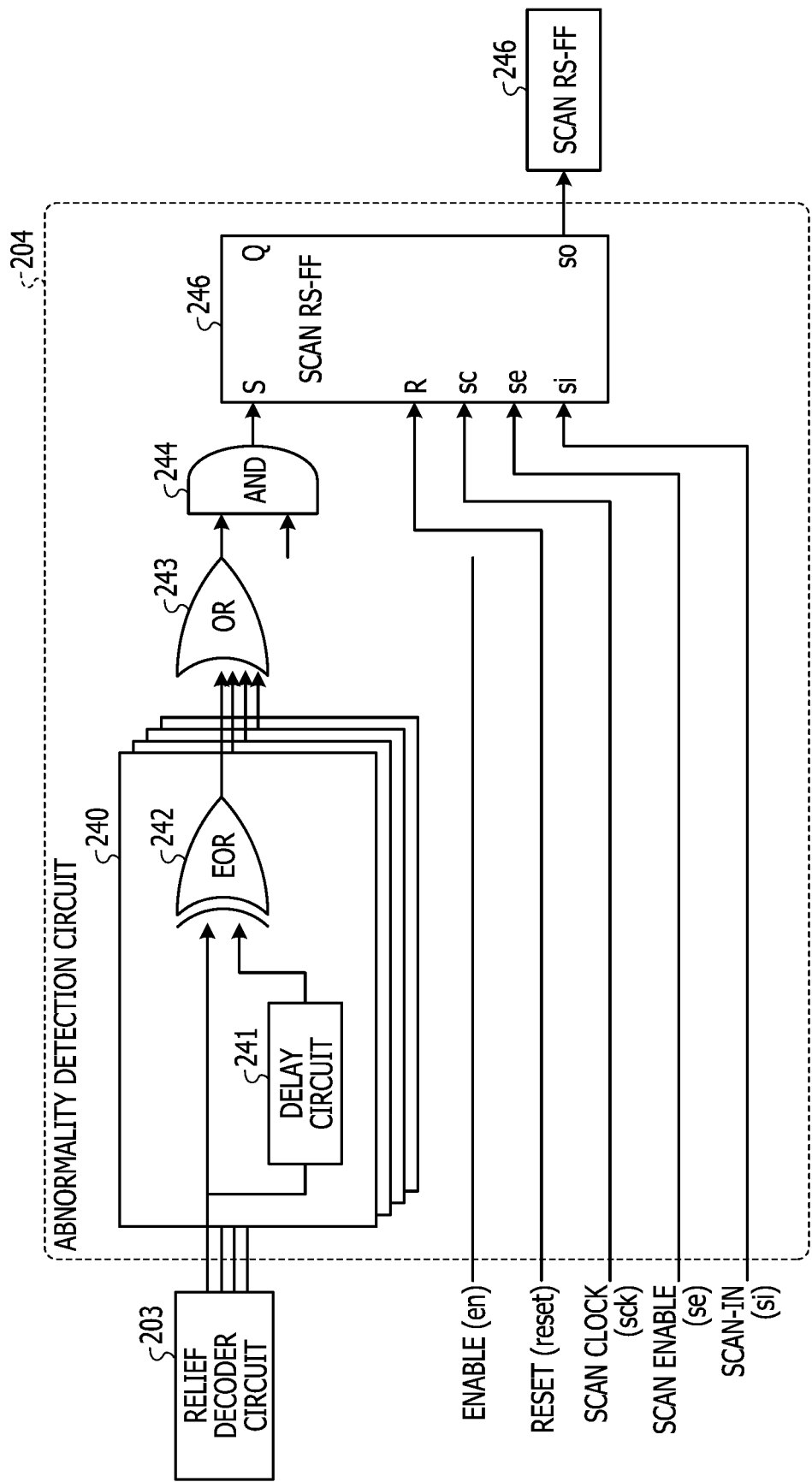
FIG. 14 is a circuit diagram of an abnormality detection circuit according to a second embodiment.
Figure 15:
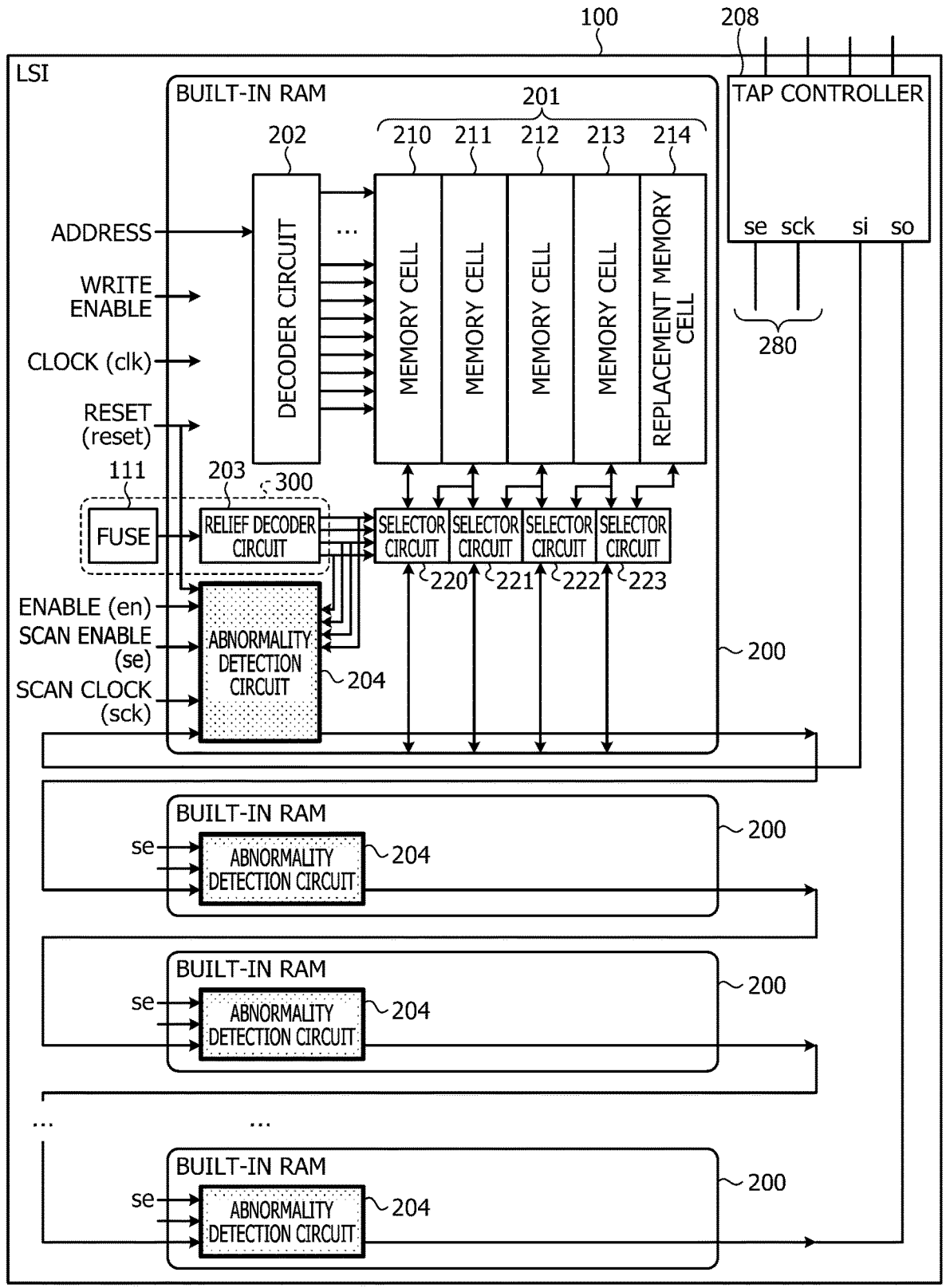
FIG. 15 is a diagram for explaining an example of an abnormality detection signal collection method according to the second embodiment.

[Second Embodiment] FIG. 14 is a circuit diagram of an abnormality detection circuit according to a second embodiment. In addition, FIG. 15 is a diagram for explaining an example of an abnormality detection signal collection method according to the second embodiment. An abnormality detection circuit 204 according to the present embodiment is different from the abnormality detection circuit 204 of the first embodiment in that a scan RS-FF 246 is used. In the following explanation, descriptions of operations of respective units similar to those of the first embodiment will be omitted.

The scan RS-FF 246 is an RS-FF having a scanning function. The scanning function is a function to read the value of the flip-flop inside LSI 100 to the outside. In addition to the reset signal, a scan clock (sck) signal, a scan enable (se) signal, and a scan-in (si) signal are input to the scan RS-FF 246.

The scan RS-FF 246 holds the abnormality detection signal output from an AND circuit 244. Then, when the scan enable signal has been turned on, the scan RS-FF 246 stores the value of the abnormality detection signal that the scan RS-FF 246 has at a predetermined position of a signal input as the scan-in signal in accordance with a scan clock. Then, the scan RS-FF 246 outputs the signal storing the value of the abnormality detection signal through a scan-out (so) terminal. In this case, the scan RS-FF 246 does not use the Q terminal for output. This scan RS-FF 246 is relevant to the holding unit 207 in FIG. 4.

As illustrated in FIG. 15, the LSI 100 is equipped with a test access port controller (TAP controller) 208. The scan RS-FFs 246 of the respective built-in RAMs 200 constitute a scan chain with the scan-in (si) terminals and scan-out (so) terminals connected in a row.

The TAP controller 208 inputs the scan-in (si) signal to the scan RS-FF 246 of a top abnormality detection circuit 204 forming the scan chain. In addition, the TAP controller 208 outputs the scan enable (se) signal and the scan clock (sck)

through terminals 280. Then, the TAP controller 208 causes each scan RS-FF 246 to perform a scan shift operation by making inputs to the scan RS-FFs 246 of all the abnormality detection circuits 204 forming the scan chain.

The TAP controller 208 has, for example, an LSI external terminal defined by Joint Test Action Group (JTAG) (IEEE 1149.1). For example, the TAP controller 208 has a test data input (TDI) terminal, a test data output (TDO) terminal, a test clock (TCK) terminal, and a test mode select (TMS) terminal as the LSI external terminals. Then, the TAP controller 208 outputs a signal on which the value of each abnormality detection signal obtained by the scan shift operation by the scan RS-FFs 246 is carried, through the TDO terminal. For example, the TAP controller 208 embeds each piece of information on abnormality detection by the abnormality detection circuits 204 into one signal in an identifiable manner to output the one signal. This TAP controller 208 is relevant to an example of an "output circuit".

In addition, here, the scan RS-FFs 246 of the abnormality detection circuits 204 are connected as a scan chain, but another flip-flop may also be connected to the scan chain. Furthermore, in this case, the finding result collection circuit 113 and the read circuit 114 need not be equipped inside the LSI 100.

As described above, the LSI according to the present embodiment may collectively read the abnormality detection signals to the outside using the scanning function. This may integrate signal lines for outputting the abnormality detection signals to the outside into one and also may locate a memory cell relief circuit 300 in which an abnormality has occurred. Therefore, failure analysis may be executed more easily with the LSI downsized.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device comprising a plurality of built-in memories, wherein
each of the built-in memories includes:
a plurality of memory cells;
a selector circuit that connects a selected memory cell among the memory cells to an outside;
a memory cell relief circuit that, when a fault has occurred in one of the memory cells, transmits, to the selector circuit, a relief signal configured to connect a normal memory cell to the outside without connecting the one of the memory cells in which the fault has occurred, to the outside, and switches selection in the selector circuit; and
an abnormality detection circuit that performs abnormality detection for the memory cell relief circuit, based on a temporal change in the relief signal output from the memory cell relief circuit during an operation, other than testing, of the built-in memories.

2. The semiconductor device according to claim 1, wherein
the abnormality detection circuit includes:
a delay circuit that gives a delay to the relief signal output from the memory cell relief circuit to generate a delayed relief signal; and
a comparator that compares the relief signal with the delayed relief signal generated by the delay circuit, and detects the temporal change in the relief signal.

3. The semiconductor device according to claim 2, wherein the abnormality detection circuit further includes a holding circuit that, when the temporal change in the relief signal is detected by the comparator, continuously holds information on the abnormality detection thereafter.

4. The semiconductor device according to claim 1, further comprising an information aggregation circuit that, when an abnormality in the memory cell relief circuit is detected by one abnormality detection circuit in one of the built-in memories, outputs the abnormality as information on an abnormality of the whole built-in memories.

5. The semiconductor device according to claim 1, further comprising an output circuit that embeds each piece of the information on the abnormality detection by the abnormality detection circuit provided for each of the built-in memories into one signal in an identifiable manner and outputs the one signal.

6. A semiconductor device control method for detecting abnormality of a plurality of built-in memories in the semiconductor device, the method comprising:
in each of the built-in memories,
connecting a selected memory cell, among a plurality of memory cells in the built-in memory, to an outside through a selector circuit;
transmitting, when a fault has occurred in one of the memory cells, a relief signal configured to connect a normal memory cell to the outside without connecting the one of the memory cells in which the fault has occurred to the outside, from a memory cell relief circuit to the selector circuit; and
performing abnormality detection for the memory cell relief circuit, based on a temporal change in the relief signal output from the memory cell relief circuit during an operation, other than testing, of the built-in memories.

* * * * *